United States Patent
Mesh et al.

(10) Patent No.: US 6,233,261 B1
(45) Date of Patent: May 15, 2001

(54) OPTICAL COMMUNICATIONS SYSTEM

(75) Inventors: Michael Mesh, Rehovot; Yossi Weiss, Pardesiya, both of (IL)

(73) Assignee: ECI Telecom Ltd., Petach Tikva (IL)

(*) Notice: Subject to any disclaimer, the term of this patent is extended or adjusted under 35 U.S.C. 154(b) by 0 days.

(21) Appl. No.: 09/284,201
(22) PCT Filed: Aug. 10, 1998
(86) PCT No.: PCT/IL98/00371
§ 371 Date: Jun. 9, 1999
§ 102(e) Date: Jun. 9, 1999
(87) PCT Pub. No.: WO99/08350
PCT Pub. Date: Feb. 18, 1999

(30) Foreign Application Priority Data

Aug. 11, 1997 (IL) ....................................................... 121510

(51) Int. Cl.[7] ...................................................... H01S 3/13
(52) U.S. Cl. ........................... 372/32; 372/20; 372/43; 372/38; 372/29; 372/6
(58) Field of Search ................. 372/32, 20, 43, 372/38, 29, 6

(56) References Cited

U.S. PATENT DOCUMENTS 5,299,212  3/1994  Koch et al. .
6,141,370 * 10/2000  Avrutsky et al. ....................... 372/20

* cited by examiner

*Primary Examiner*—Leon Scott, Jr.
(74) *Attorney, Agent, or Firm*—Browdy & Neimark

(57) ABSTRACT

Apparatus for simultaneously monitoring and controlling the wavelength of a plurality of semiconductor lasers whose wavelengths can be adjusted, the device including a wavelength filter including a wavelength division demultiplexer (WDM) arranged to receive a portion of the output power of each laser and divide the laser output between two filter outputs, a photoreceiver arranged to measure the power at each filter output, a processor arranged to selectably compute the ratio of the power at the two filter outputs for each laser, apparatus to compare the computed ratio with a predetermined reference ratio for the selected laser, and apparatus to adjust the wavelength of the selected laser in response to the comparison.

21 Claims, 3 Drawing Sheets

OPTICAL COMMUNICATIONS SYSTEM

FIELD OF THE INVENTION

The present invention relates to a device for simultaneously monitoring and controlling laser wavelength for a plurality of lasers, in general and, in particular, to an optical telecommunications system including such a device.

BACKGROUND OF THE INVENTION

Modern telecommunications systems utilize lasers to transmit data via silica optical fibers. Two wavelength ranges are used at present—around 1550 nm and around 1330 nm. Superposing, transmitting, and then separating signals transmitted at these ranges from one another by coarse multiplexers is well known in the art.

As technology progresses, there is more and more data to be transmitted over the same optical fibers, such as cable TV, telephone, videos, and on-line services. In order to increase the quantity of data which can be transmitted, broadband systems have been developed having a plurality of channels which permit the transmission of data over lasers having wavelengths very close to one another. For this purpose, dense wavelength division multiplexers (WDM) are used. The current standard permits the use of wavelength separation of 1.6 nanometers and 0.8 nanometers from one another, which means that, in a range of 40 nm, 16 or 32 channels can be used, a channel being determined by a specified optical frequency band.

In order to maintain each laser at the proper wavelength, thereby providing acceptable system performance by eliminating long-term frequency drifts causing crosstalk between channels and facilitating channel recognition, wavelength stabilization and tuning for each of the lasers is required. The semiconductor lasers currently used fall into two categories—fixed wavelength lasers, such as DFB (distribution feedback) lasers, which are wavelength selected for a particular channel and then tuned, as with temperature, to operate at a standardized wavelength, and tunable lasers, such as DBR (distributed Bragg reflection) lasers, whose frequency can be switched or tuned to any desired frequency and stabilized in the desired channel.

A number of proposals have been made in the literature as to ways to monitor and control the wavelength of lasers in wavelength-division multiplexer systems. The most common solution is to lock each transmitter frequency to a stable optical reference, such as an Etalon filter. A synchronized Etalon filter which provides a set of equally spaced references at the standardized wavelengths, is set forth by J. H. Jang, et al., in "A Cold-Start WDM System Using a Synchronized Etalon Filter", IEEE Photonics Technology Letters, Vol. 9, No. 3, March 1997, pp 383. Other absolute references are discussed by Martin Guy, "Simultaneous Absolute Frequency Control of Laser Transmitters in both 1.3 and 1.455 $\mu$m Bands for Multiwavelength Communication Systems", Journal of Lightwave Technology, Vol. 14, No. 6, June 1996, pp 1136, and by U. Kruger, et al., "Decentralized Frequency Stabilization Scheme for a Dense OFDM System Involving Simple Filters and an Absolute Reference", Journal of Lightwave Technology, Vol. 14, No. 5, May 1996, pp 649.

Other suggestions involve the use of an arrrayed-waveguide grating, such as M. Teshima, et al, "Multiwavelength simultaneous monitoring circuit employing wavelength crossover properties of arrayed-waveguide grating", Electronics Letters, Vol. 31, No. 18, Aug. 31, 1995, pp 1595, and K. Okamoto, "Fabrication of multiwavelength simultaneous monitoring device using arrayed-waveguide grating", Electronics Letters, Vol. 32, No. 6, Mar. 14, 1996, pp 569, or cascaded fibre Bragg gratings, as in C. S. Park, et al., "Frequency locking using cascaded fibre Bragg gratings in OFDM systems", Electronics Letters, Vol. 32, No. 12, Jun. 6, 1996.

A further proposal includes a frequency control scheme for multiple DBR lasers in a VWP cross-connect system described by M. Teshima, et al., "100-GHz-Spaced 8-Channel Frequency Control of DBR Lasers for Virtual Wavelength Path Cross-Connect System", IEEE Photonics Technology Letters, Vol. 8, No. 12, December 1996, pp 1701.

Alternatively, the deviations in transmission frequency can be measured at the remote node. One example is to lock the wavelength comb of a tunable DBR to a waveguide grating router to enable a laser to track and correct uncontrolled changes in a remotely located WDM device, shown by Derek Mayweather, et al., "Wavelength Tracking of Remote WDM Router in a Passive Optical Network", IEEE Photonics Technology Letters, Vol. 8, No. 9, September 1996, pp 1238. Another is the fiber grating proposed by Randy Giles, "Fiber-Grating Sensor for Wavelength Tracking in Single-Fiber WDM Access PON's", Electronics Technology Letters, Vol. 9, No. 4, April 1997, pp 523. Yet another utilizes a narrow-band reflective fiber grating at a temperature sensor at the remote receiver.

These proposed devices are either complicated mechanically, and require a different monitoring element for each laser, or they rely on an external reference to maintain the laser wavelength.

Accordingly, there is a long felt need for a simple device for simultaneously monitoring and controlling laser wavelength for a plurality of lasers which is relatively simple, highly accurate, and which is substantially unaffected by temperature.

There is shown, in our co-pending Israel patent application filed together herewith, a device for monitoring and controlling the wavelength of a single fixed wavelength cooling laser, the device including a wavelength division demultiplexer (WDM) filter arranged to receive a portion of the output laser power of the laser and divide the laser output between the two filter outputs, a photoreceiver arranged to measure the power at each filter outlet, an processor arranged to compute the ratio of the power at the two filter outputs, apparatus to compare the computed ratio with a predetermined reference ratio, and apparatus to adjust the wavelength of the laser in response to the comparison.

SUMMARY OF THE INVENTION

According to the present invention, there is provided apparatus for simultaneously monitoring and controlling the wavelength of a plurality of semiconductor lasers whose wavelengths can be adjusted, the device including a wavelength filter including a wavelength division demultiplexer (WDM) arranged to receive a portion of the output power of each laser and divide the laser output between two filter outputs, a photoreceiver arranged to measure the power at each filter output, a processor arranged to selectably compute the ratio of the power at the two filter outputs for each laser, apparatus to compare the computed ratio with a predetermined reference ratio for the selected laser, and apparatus to adjust the wavelength of the selected laser in response to the comparison.

According to one embodiment of the invention, the wavelength filter has an optical spectral range of about 40 nm around 1550 nm, and is centered at a wavelength within this range.

According to another embodiment of the invention, the apparatus for adjusting the wavelength includes a temperature regulator associated with each laser, and means in said processor to activate said temperature regulator until said computed ratio substantially equals said predetermined reference ratio.

According to a further embodiment of the invention, the device includes indicating means for indicating which laser output ratio is being computed at any given time. According to one embodiment, individual indicating means is associated with each laser. According to an alternative embodiment, an indicating means is actuated by the processor for each laser sequentially.

There is also provided in accordance with the present invention a method for monitoring and controlling the wavelength of a plurality of semiconductor lasers whose wavelengths can be adjusted, the method including the steps of:

(a) feeding a portion of the output laser power of a first laser to a wavelength filter including a wavelength division demultiplexer (WDM) arranged to receive the laser output power and divide it between two filter outputs;

(b) measuring the power at each of the two filter outputs;

(c) computing the ratio of the power at the two filter outputs;

(d) comparing the computed ratio with a predetermined reference ratio for the first laser;

(e) adjusting the wavelength of the first laser in response to the comparison;

(f) feeding a portion of the output laser power of a second laser to the wavelength filter;

(g) measuring the power at each of the two filter outputs;

(h) computing the ratio of the power at the two filter outputs for the second laser;

(i) comparing the computed ratio with a predetermined reference ratio for the second laser;

(j) adjusting the wavelength of the second laser in response to the comparison; and (k) repeating steps (f) through (j) for each laser until the computed ratios substantially equal the predetermined reference ratios.

According to a preferred embodiment of the invention, the method also includes the step of causing each laser to provide an identifying signal to the controlling processor together with the laser output.

BRIEF DESCRIPTION OF THE DRAWINGS

The present invention will be further understood and appreciated from the following detailed description taken in conjunction with the drawings in which.

DETAILED DESCRIPTION OF THE INVENTION

The present invention relates to a device and method for monitoring and controlling the wavelength of a plurality of semiconductor lasers, particularly in an optical telecommunications system. The invention is based on the use of the method of our co-pending patent application number. The invention utilizes a wavelength filter including a wavelength division demultiplexer (WDM) which divides a multiplexed input including a plurality of wavelengths between two outputs through the filter bandwith center or 0 point. In the past, such multiplexers have been used as demultiplexers for signals including a number of wavelengths, to divide the wavelengths into groups. Since the ratio of the power at the two filter outputs is highly dependent upon the input wavelength, the present invention utilizes this ratio, calculated for each laser in turn, in order to monitor and control the input wavelength coming from each laser. Thus, the filter in the present invention takes a single wavelength and divides its power between the two filter outputs.

It is a particular feature of the present invention that the ratio of the power at the outputs of the wavelength filter is substantially unaffected by temperature. (At present, the effect of changing temperature is on the order of 0.001 nm per ° C. variance, which is negligible in the present context.) Thus, this wavelength filter acts as its own reference, so no external reference is required for calibration. Furthermore, since this is a passive filter, there is very low cross-talk, and ratios can be measured with extremely high accuracy, providing for resolution of about 0.6 dB/nm.

Figure 1:
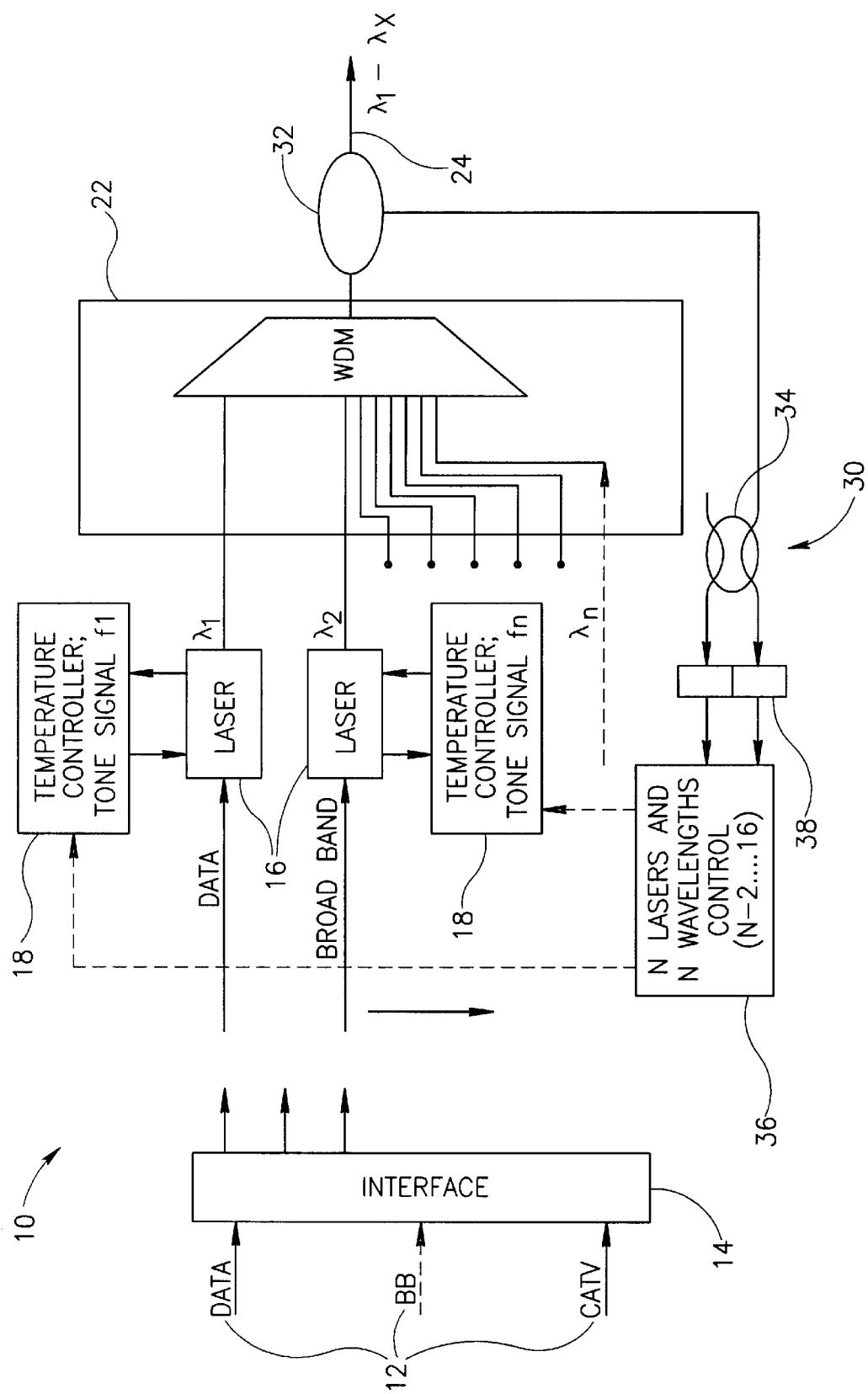
FIG. 1 is a schematic illustration of a device for monitoring and controlling the wavelength of a plurality of lasers constructed and operative in accordance with one embodiment of the invention.

Referring now to FIG. 1, there is shown a schematic illustration of an optical telecommunications system 10 including input data from a plurality of sources 12, such as telephone, broad band, cable television, and so on, which passes through an interface 14 and is converted to optical output data in a plurality of lasers 16. Lasers 16 can be any semiconductor lasers whose wavelength can be adjusted, including fixed wavelength cooling lasers, such as DFB lasers, for example FU-655-PDF-2 of Mitsubishi Electric Corp. and LCS2210 of Hewlett-Packard, and tunable lasers, including DBR lasers, such as LD5000DBR series of GEC Marconi.

A wavelength regulator 18 is associated with each laser 16 and adjusting the output wavelength. Wavelength regulator 18 can be a thermo electric cooler, for changing the wavelength by adjusting the temperature, or any other means for adjusting wavelength, as known. Each laser 16 provides an output at a different wavelength $\lambda 1$, $\lambda 2$, and so on through $\lambda n$. All the wavelengths $\lambda$ are coupled by an N×1 coupler, or by a dense wavelength division multiplexer (dense WDM) 22 which multiplexes the signals and transmits them over an optical fiber 24, all as known.

Telecommunications system 10 also includes a device 30 constructed and operative in accordance with one embodiment of the invention for monitoring and controlling the wavelength of the plurality of lasers 16. The output of dense WDM 22 passes through a splitter 32, such as a 90/10 coupler, which basses 90% (or other selected percentage) of the laser signal to the desired destination, and 10% (or other remaining percentage) to the device 30 of the present invention. Device 30 includes a wavelength filter 34 and a processor 36, which can be a microprocessor. Wavelength filter 34 includes a wavelength division demultiplexer (WDM) whose center is selected in accordance with the bandwidth of wavelengths of the lasers to be monitored. According to one embodiment of the invention, most useful at present for optical fiber communications, the wavelength filter has a spectral range of about 40 nm around 1550 nm, and is centered at a wavelength within this range. According to an alternative embodiment, the wavelength filter is operative in the 1330 nm range, when lasers in this wavelength range are utilized. It will be appreciated that since it is the ratio of the filter outputs (and not their absolute values) that is of interest, the precise center location is not important, so long as the filter is operative throughout the entire wavelength range of interest.

Controlling processor 36 is coupled through a pair of photoreceivers 38 to the outputs of wavelength filter 34, and to wavelength regulator 18 of each laster 16. Photoreceivers 38 measure the laser power at filter output and provide them to controlling processor 36 through an Analog to Digital (A/D) converter. Controlling processor 36 is adapted to compute the ratio of the output power measurements from the two filter outputs. Each laser is actuated sequentially, or provides a unique identifying signal, so that processor 36 knows from which laser the signal is being monitored. Processor 36 includes a comparator which compares the computed ratio with the predetermined reference ratio for the particular laser being monitored. If the ratio is not equal to the reference ratio, processor 36 sends a signal to wavelength regulator 18 associated with the particular laser to raise or lower the wavelength of that laser 16. Since laser 16 is continuously emitting light, controlling processor 36 will again compute the output power ratio of this laser, in its turn, compare it to the reference ratio and adjust the laser until the two ratios are substantially equal.

Figure 2:
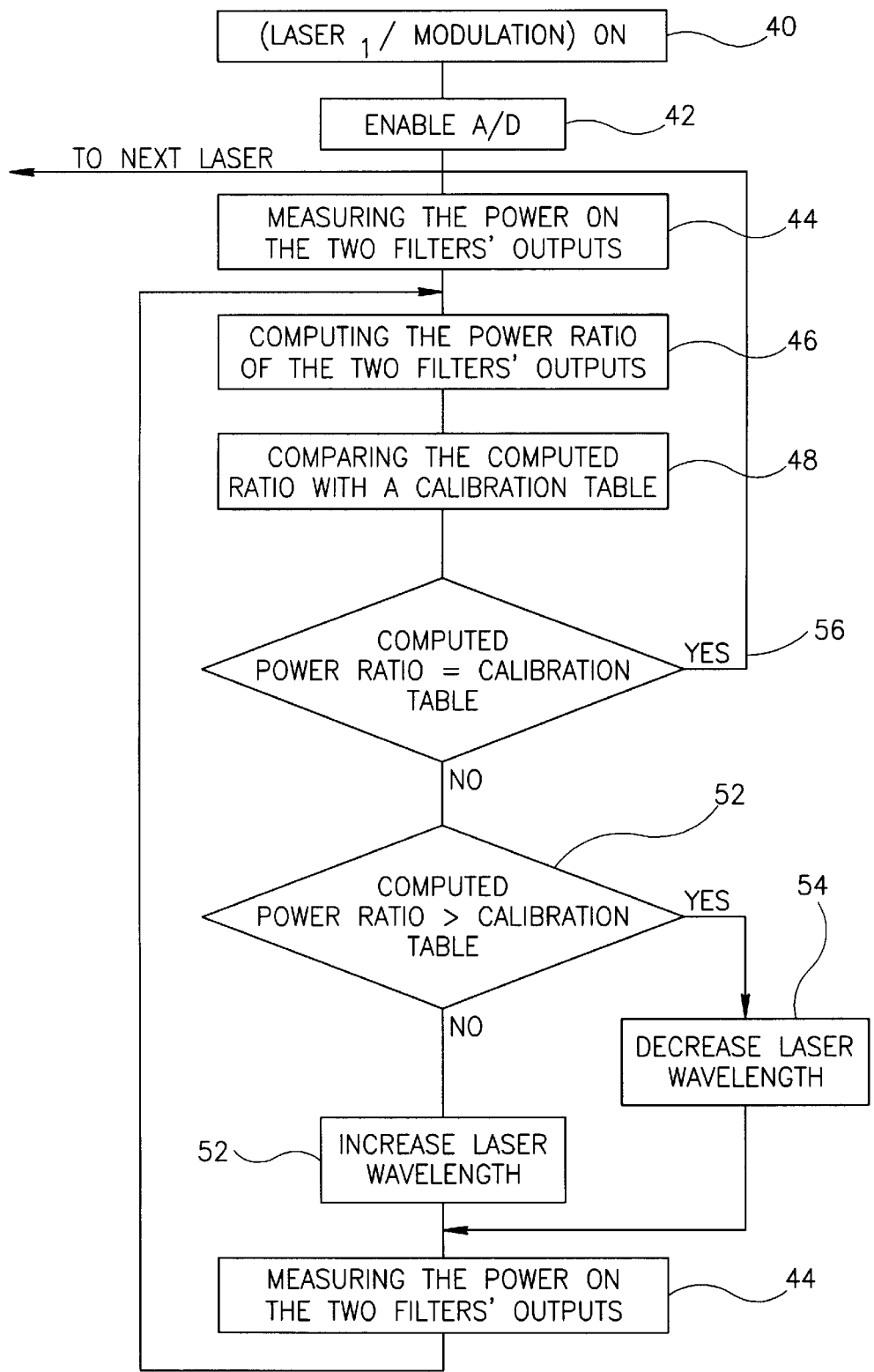
FIG. 2 is a flow chart illustrating the operation of a controlling processor in the device of the present invention.

Operation of the device of FIG. 1 is as follows, with reference to FIG. 2, which shows a flow chart illustrating the operation of controlling processor 36. First, the device is calibrated. Lasers 16 are tuned to the proper transmission wavelengths. Each laser 16, in turn, transmits a signal to wavelength filter 34. The ratio of the output power above the center of the filter bandwidth and the output power below the center of the filter bandwidth is calculated by processor 36 and stored as the predetermined reference ratio for that particular laser.

After calibration, all the laser light carrying data at wavelengths λ1 to λn is fed through interface 34 into dense WDM 22, which multiplexes the signals and transmits them over optical fiber 24. The multiplexed signal passes through a coupler or splitter which transfers most of the signal to a remote node, which may be a dense waveguide division demultiplexer, and a small portion of the signal to the WDM of wavelength filter 34. When it is desired to monitor a first laser which should be transmitting at a wavelength of λ1, processor 36 activates modulation 40 of the first laser and enables an Analog-to-Digital (A/D) converter 42 (see FIG. 2), or provides another indication for identifying the output signal of the first laser. When this output signal passes through wavelength filter 34, the output power or intensity at both filter outputs is measured 44 by photoreceivers 38. Processor 36 calculates 46 the ratio of the two power outputs, and compares 48 the ratio with the predetermined reference ratio for that laser. If the ratios are not substantially identical, or within a predefined tolerance, such as ±0.1 nm, processor 36 activates wavelength regulator 18 in the first laser 16 to either increase 52 or decrease 54 the wavelength of first laser 16.

If the ratios are substantially identical or within the predefined tolerance 56, or the wavelength of the first laser has been adjusted, processor 36 activates modulation of a second laser, or provides another indication for identifying the output signal of the second laser. When this output signal passes through wavelength filter 34, the output power or intensity at both filter outputs is measured by photoreceivers 38. Processor 36 calculates the ratio of the two power outputs, and compares the ratio with the predetermined reference ratio for the second laser. If the ratios are not substantially identical, or within the predefined tolerance, processor 36 activates wavelength regulator 18 in the second laser 16 to adjust the wavelength in the desired direction.

According to one embodiment of the invention, this process continues until each laser has been monitored sequentially, at which time processor 36 begins again with the first laser. According to another embodiment, lasers which have been adjusted can be re-monitored, or any laser can be monitored as desired, by providing an identifying signal with its transmitted signal. In the first case, a single tons generator is used, and each of the lasers is modulated sequentially. Only one laser is monitored and controlled at the time of a single measurement. In the second case, each laser is provided by a low-frequency tone generator with a modulation frequency fx, i.e., a unique selected frequency transmitted with the laser's signals. During the process of laser monitoring, only the signal modulated with the specific tone signal is selected after the wavelength filter, and the power ratio of this signal is measured. Thus, in the first case, the identifying signal is transmitted only in response to a request from processor 36, which reduces the disturbance of the transmitted data. In the second case, the identifying signal is transmitted continuously together with the data, which gives more flexibility in the event that one laser must be adjusted.

The present invention is particularly suitable for use in access optical telecommunication systems. Unlike point-to-point system, wherein each laser transmits from a single location to a single location, in access systems, the network topology is much more complicated, for example, lasers can transmit from different locations to a single interface which later divides them again to local curbs, and from there to the individual user.

Figure 3:
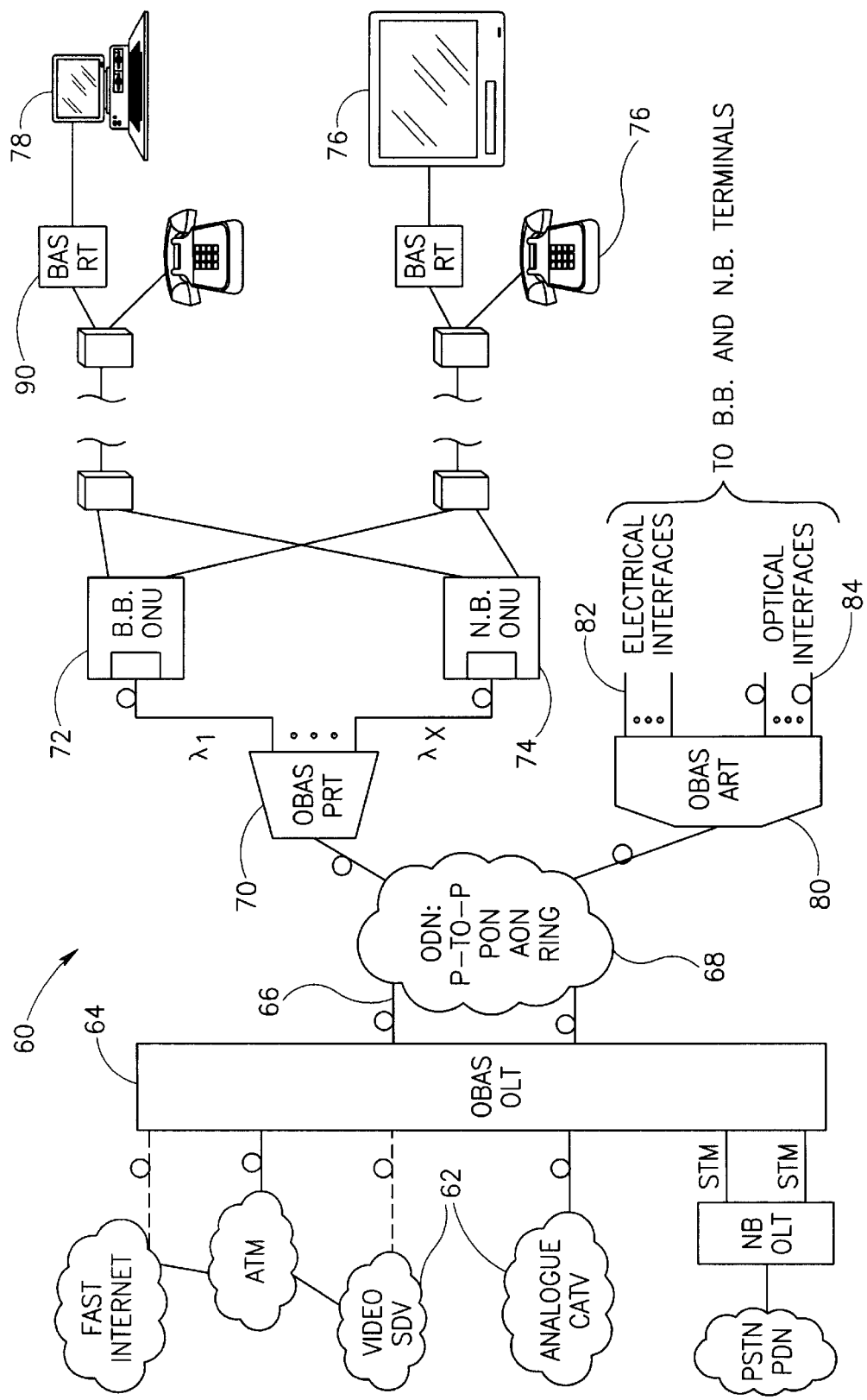
FIG. 3 is a schematic illustration of a telecommunications system according to one embodiment of the present invention.

Referring now to FIG. 3, there is shown a schematic illustration of an optical broadband access system (OBAS) 60 constructed and operative in accordance with the present invention for full service access optical telecommunications networks. It is a particular feature of the present invention that the OBAS is a bi-directional, broadband system including wavelength monitoring and control by means of the disclosed wavelength filter. The system 60 permits the transfer of a number of types of data 62 over the same fiber cable, including cable broadcast TV, Pay Per View, Near Video on Demand; Video on Demand, Fast Internet, and high definition television, as well as telephones, both POTS and ISDN. Different protocols can be used for signal transmission. All the data is input to the optical line terminal (OLT) 64 of the OBAS. The OLT is substantially identical to that illustrated in FIG. 1, and serves as an interface from the source of the data to a plurality of lasers (not shown), preferably between 2 and 16, each transmitting on a wavelength separated by 0.8 or 1.6 nanometers. The optical line terminal 44 operates substantially as described with reference to FIG. 1, dividing out a small portion of the transmitted signal, modulating each laser in turn to monitor its output signal, passing the laser's signal through a wavelength filter and computing the ratio of the filter output power or intensity. The ratio is compared with the calibrated reference ratio and the laser wavelegth is adjusted, as required. The OLT 64 preferably includes protection or redundancy in case a laser breaks.

All the data is transmitted over a single optical fiber 66 to the network 68. Network 68 can be point-to-point or a ring, a passive optical network, an active optical network, or any other conventional network.

The signals from the network are sent to either an OBAS passive remote terminal 70, which transmits the optical signals further along the network, or to an OBAS active remote terminal 80, which transfers some of the optical signals while converting others to electrical signals.

Passive remote terminal 70 includes a conventional dense demultiplexer (not shown) which divides the wavelengths so that some go to a broadband optical network unit 72 and the rest to a narrow band optical network unit 74. The units 72 and 74 convert the wavelength to electrical signals which go to the end user. Those electrical signals going to passive devices 76, such as telephones or broadcast television, go directly to the device. Those electrical signals going to interactive devices 78, such as PC modem or video on demand converter, pass through a broadband access system active remote terminal 90.

OBAS active remote terminal 80 also transfers the data to broadband and narrow band terminals (not shown) over electrical interfaces 82 and optical interfaces 84. It will be appreciated that the optical signals transmitted over the optical interface 84 may be on a different wavelength than that on which they were received.

Those skilled in the art will appreciate that wavelength monitoring and control is important in each location where there is a laser. Thus, the wavelength monitoring and control device of FIG. 1 (or of our co-pending application) will be useful, not only in the OLT, but also in each remote terminal having one or more lasers for communication.

It will be appreciated that the invention is not limited to what has been described hereinabove merely by way of example. Rather, the invention is limited solely by the claims which follow.

What is claimed is:

1. Apparatus for monitoring a plurality of sources of optical radiation, each of the sources producing radiation having a particular wavelength, the apparatus comprising:

a wavelength filter composed of a wavelength division demultiplexer (WDM) having an input and two outputs, said filter being connected to receive a portion of the radiation produced by a selected one of the sources and to divide the received radiation into two parts each having a respective power level and each supplied to a respective one of said two filter outputs;

two photoreceivers each coupled to a respective one of said two filter outputs for producing signals representing the power levels of the radiation supplied to said two filter outputs; and a processor coupled to said photoreceivers for computing the ratio of the power level of the radiation supplied to one of said filter outputs to the power level of the radiation supplied to the other one of said filter outputs, and for producing a comparison of the computed ratio with a predetermined reference ratio out of a plurality of predetermined reference ratios.

2. The apparatus of claim 1, wherein said wavelength filter has an optical spectral range of about 40 nm around 1550 nm, and is centered at a wavelength within this range.

3. The apparatus of claim 1, further comprising laser identifying means for indicating which source output ratio is being computed at any given time.

4. The apparatus of claim 3, wherein said source identifying means includes a unique tone signal associated with a transmission of said source.

5. The apparatus of claim 1 wherein each of said plurality of predetermined reference ratios relates to a respective one of the plurality of sources.

6. The apparatus of claim 5 wherein each of said plurality of sources is a semiconductor laser producing radiation having a wavelength that is adjustable.

7. The apparatus of claim 6 for additionally adjusting the plurality of semiconductor lasers, said apparatus further comprising:

a wavelength adjuster to adjust the wavelength of the radiation produced by the selected laser in response to the comparison produced by said processor.

8. The apparatus of claim 7, wherein said wavelength adjuster includes a temperature regulator associated with each source, and means in said processor to activate said temperature regulator until said computed ratio equals said predetermined reference ratio.

9. The apparatus of claim 1 wherein said source of said at least one remote terminal is a semiconductor laser producing radiation having a wavelength that is adjustable.

10. The apparatus of claim 9 for additionally adjusting the semiconductor laser, said apparatus further comprising:

a wavelength adjuster to adjust the wavelength of the radiation produced by the laser in response to the comparison produced by said second processor.

11. A method for monitoring a plurality of sources of optical radiation, each of the sources producing radiation having a particular wavelength, the method including the steps of:

(a) providing a predetermined reference ratio for each source of said plurality of sources;

(b) selecting a first source of said plurality of sources for monitoring;

(c) providing a wavelength filter composed of a wavelength division demultiplexer (WDM) having an input and two outputs;

(d) feeding a portion of the radiation produced by the first source to the input so as to divide the received radiation into two parts each having a respective power level and each supplied to a respective one of the two filter outputs;

(e) measuring the power level at each of the two filter outputs;

(f) computing the ratio of the power level of the radiation supplied to one of the filter outputs to the power level of the radiation supplied to the other one of the filter outputs;

(g) producing a comparison of the computed ratio with the predetermined reference ratio for the first source; and (h) repeating steps (c) through (g) for every source of the plurality of sources until the ratios computed in said computing step substantially equal the respective predetermined reference ratios.

12. The method of claim 11, further including the step of causing each source to provide an identifying signal to said processor together with the source output.

13. The method of claim 11 wherein each of said plurality of predetermined reference ratios relates to a respective one of the plurality of sources.

14. The method of claim 13 wherein each of said plurality of sources is a semiconductor laser producing radiation having a wavelength that is adjustable.

15. The method of claim 14 for additionally adjusting the plurality of semiconductor lasers, said method further comprising:

adjusting the wavelength of the radiation produced by the selected laser in response to the comparison.

16. An optical communication system comprising:

(a) an optical line terminal (OLT) for receiving data from at least one data source and providing the data to a network, the OLT including:

at least one source producing radiation having a particular wavelength; and a wavelength monitoring apparatus including:

a wavelength filter composed of a wavelength division demultiplexer (WDM) having an input and two outputs, said filter being connected to receive a portion of the radiation produced by the source and to divide the received radiation into two parts each having a respective power level and each supplied to a respective one of said two filter outputs;

two photoreceivers each coupled to a respective one of said two filter outputs for producing signals representing the power levels of the radiation supplied to said two filter outputs; and a processor coupled to said photoreceivers for computing the ratio of the power level of the radiation supplied to one of said filter outputs to the power level of the radiation supplied to the other one of said filter outputs, and for producing a comparison of the computed ratio with a predetermined reference ratio for the at least one semiconductor source; and (b) at least one remote terminal including at least one source.

17. The system of claim 16, wherein at least one laser includes a plurality of semiconductor sources having adjustable wavelengths, each transmitting on a wavelength separated by 0.8 or 1.6 nanometers.

18. The system of claim 16 wherein said source is a semiconductor laser producing radiation having a wavelength that is adjustable.

19. The system of claim 18 for additionally adjusting the semiconductor laser, wherein said apparatus further comprises:

a wavelength adjuster to adjust the wavelength of the radiation produced by the laser in response to the comparison produced by said processor.

20. The system of claim 16, wherein said at least one source of said at least one remote terminal produces radiation having a particular wavelength and said at least one remote terminal comprises a second wavelength monitoring apparatus including:

a second wavelength filter composed of a wavelength division demultiplexer (WDM) having an input and two outputs, said second filter being connected to receive a portion of the radiation produced by said source of said at least one remote terminal and to divide the received radiation into two parts each having a respective power level and each supplied to a respective one of said two filter outputs;

two second photoreceivers each coupled to a respective one of said two filter outputs of said second wavelength filter for producing signals representing the power levels of the radiation supplied to said two filter outputs; and a second processor coupled to said second photoreceivers for computing the ratio of the power level of the radiation supplied to one of said filter outputs to the power level of the radiation supplied to the other one of said filter outputs of said second wavelength filter, and for producing a comparison of the computed ratio with a predetermined reference ratio for said source of said at least one remote terminal.

21. The system of claim 20, wherein said at least one source includes a plurality of semiconductor sources having adjustable wavelengths, each transmitting on a wavelength separated by 0.8 or 1.6 nanometers.

* * * * *